United States Patent [19]
Liu

[11] Patent Number: 5,720,845
[45] Date of Patent: Feb. 24, 1998

[54] WAFER POLISHER HEAD USED FOR CHEMICAL-MECHANICAL POLISHING AND ENDPOINT DETECTION

[76] Inventor: Keh-Shium Liu, 4F-1, No. 25-3, Chu-Chung Rd., Chutung Chen, Hsinchu Hsien, Taiwan

[21] Appl. No.: 587,505

[22] Filed: Jan. 17, 1996

[51] Int. Cl.⁶ .......................... H01L 21/304; B24B 37/04
[52] U.S. Cl. .............. 156/345; 156/627.1; 156/636.1; 216/86; 216/88
[58] Field of Search .................... 156/345, 636.1, 156/627.1; 216/86, 88

[56] References Cited

U.S. PATENT DOCUMENTS

| | | | |
|---|---|---|---|
| 4,606,151 | 8/1986 | Heynacher | 51/62 |
| 4,873,792 | 10/1989 | Linke et al. | 51/165.8 |
| 5,036,015 | 7/1991 | Sandhu et al. | 437/8 |
| 5,321,304 | 6/1994 | Rostoker | 252/621 |
| 5,472,374 | 12/1995 | Yamada | 451/303 |

FOREIGN PATENT DOCUMENTS

| | | |
|---|---|---|
| 58-015238 | 1/1983 | Japan . |
| 6-196456 | 7/1994 | Japan . |
| 6-216095 | 8/1994 | Japan . |
| 7-086393 | 3/1995 | Japan . |
| 7-130686 | 5/1995 | Japan . |

*Primary Examiner*—R. Bruce Breneman
*Assistant Examiner*—George Goudreau
*Attorney, Agent, or Firm*—Michael D. Bednarek; Kilpatrick Stockton LLP

[57] ABSTRACT

A polishing head is suitable for polishing a semiconductor wafer and for providing endpoint detection during chemical-mechanical polishing. The head features an arrangement of patterned active actuators and load cells above the wafer to fully control the wafer surface profile changes and provide endpoint detection during the polishing processes. Each active actuator applies pressure according to the local coated thin film thickness on the wafer and relative velocity between the wafer and polishing pad. The load cell senses the actual force pressing on the wafer and feeds the information back to the actuator to adjust the force to a preset value. The planar endpoint is detected by sensing a change in friction force between different thin film material on the wafer. The change in friction force is detected by the load cell and a signal is produced to adjust or stop the process.

8 Claims, 10 Drawing Sheets

WAFER POLISHER HEAD USED FOR CHEMICAL-MECHANICAL POLISHING AND ENDPOINT DETECTION

BACKGROUND OF THE INVENTION

1. Field of the Invention

The present invention relates to the manufacture of semiconductor devices. In particular, the present invention relates to making semiconductor devices and detecting a planar endpoint in a semiconductor wafer during chemical-mechanical polishing.

2. Description of Prior Art

In the manufacture of semiconductor devices, most Ultra Large Scaled Integrated (ULSI) circuits are formed by depositing, doping and patterning in layers through various processes and various materials which are either conductive, insulating or semiconducting. As ULSI devices are scaled down to even smaller dimensions, Multilevel Interconnections (MLI) are needed to connect the millions and soon billions of transistors on the chip. Fabrication of such MLIs requires planarization on a global scale to alleviate the problems associated with lithography and etching. Many planarization techniques, including oxide reflow, resist etchback, spin-on-glass with etchback, and deposition-etch-deposition sequences are used in IC processing to achieve planarity, but only provide ranges <100 µm.

Chemical-mechanical polishing (CMP) technology is being developed to provide the global planarization needed for fabricating sub-half micro ULSI devices. While the operations of CMP are simple, it is difficult to achieve accurate control for planarized ICs. In the CMP process, a rotating polishing head holds a thin, flat wafer under controlled pressure against a rotating polishing platen with polishing slurry. The polishing platen is typically covered with polyurethane. The most popular polishing slurry for interlevel dielectric film material for example, is colloidal silica in an aqueous KOH solution.

In the past, the chemical-mechanical polishing process has been accomplished by controlling the wafer head downward pressure, relative rotational speed between head and platen, chemical slurry feed rate and the time of the planarization process. The prior art uses uniform air pressure to press the wafer on the pad to polish the coated film material. However, the wafer thickness from one side to the other varies from a few micrometers to more than 10 µm, the thin film on the wafer coated from CVD or other methods is also nonuniform. The pad profile is not flat and is changing during the polishing processes. The thickness variation of the insert and its back glue which set between the wafer and polishing head holder are even greater than wafer's. The planar endpoint of a planarized surface has been detected by sensing a change in the coefficient of friction between the surface of the wafer and the platen. The sensing comprises a current meter which senses a change in electric signal from driving the head and platen's motors.

Many problems encountered with the process methods mentioned above, such as nonuniformity of removal rates across the wafer (depending on the pattern density or location), variation of equipment parameters, and a too small signal for satisfactory endpoint detection.

It can be seen that the conventional methods of planarizing do not achieve global planarity and accurate endpoint detection. The present invention concerns novel methods and an apparatus for globally planarizing features and in situ accurate endpoint detection for a wafer during the chemical-mechanical polishing process.

SUMMARY OF THE INVENTION

In accordance with the present invention, there is provided a polishing head for polishing a semiconductor wafer on a platen, which comprises a flexible plate, a plurality of actuators, a reaction plate, a motor driver, a packing plate, a plurality of load cells, a flexible carrier plate, a vacuum source and a microprocessor.

Each of the actuators has a DC-motor and a moving part, wherein the moving part is coupled with the DC-motor to exert a force on the flexible plate. The reaction plate is used for fixing the actuators.

The packing plate comprises a plurality of units packed together. Each load cell is correspondingly sandwiched between the flexible plate and one of the units.

The flexible carrier plate is provided with a plurality of holes and fixed on the bottom of the head for carrying the packing plate. The vacuum source can provide a vacuum force through the holes to hold the wafer on the bottom of the head.

Each load cell senses the force exerted on the flexible plate and outputs first signals accordingly. Then, the microprocessor receives the first signals and controls the motor driver to sequentially drive the DC-motors. Also, each load cell senses the shear friction forces between the wafer and the platen through the flexible plate and then sends second signals to the microprocessor which decides when to stop polishing the wafer based on an endpoint. The endpoint is defined as the changes of the shear friction forces. Alternatively the endpoint is defined as an coating of the wafer polished to a surface including a different material.

The wafer has a flat cut, and the load cells can detect the flat cut and send third signals to the microprocessor which then adjusts the force exerted by the DC-motor based on the first and third signals.

BRIEF DESCRIPTION OF THE DRAWINGS

The present invention can be more fully understood by reading the subsequent detailed description and examples with references made to accompanying drawings, wherein.

DETAILED DESCRIPTION OF THE PREFERRED EMBODIMENT

Figure 1:
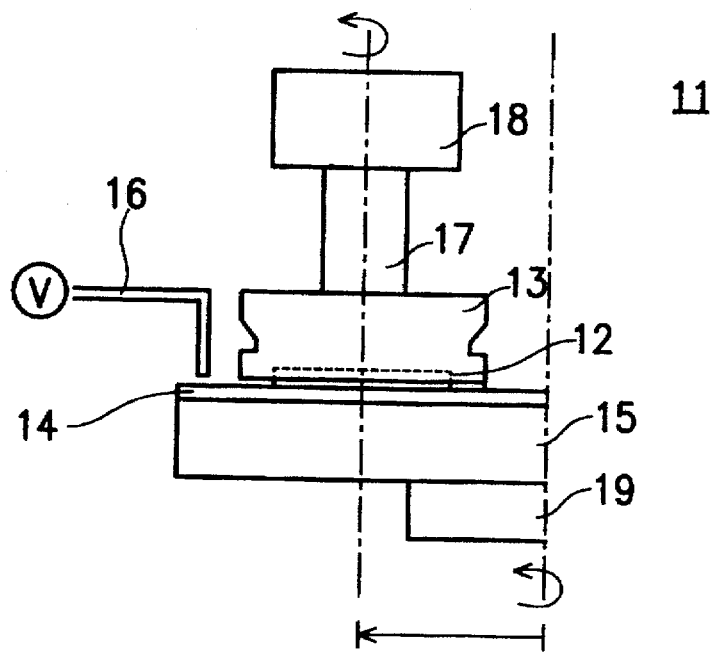
FIG. 1 is a schematic view of chemical-mechanical polishing apparatus having a polishing head constructed in accordance with this invention.
Figure 2:
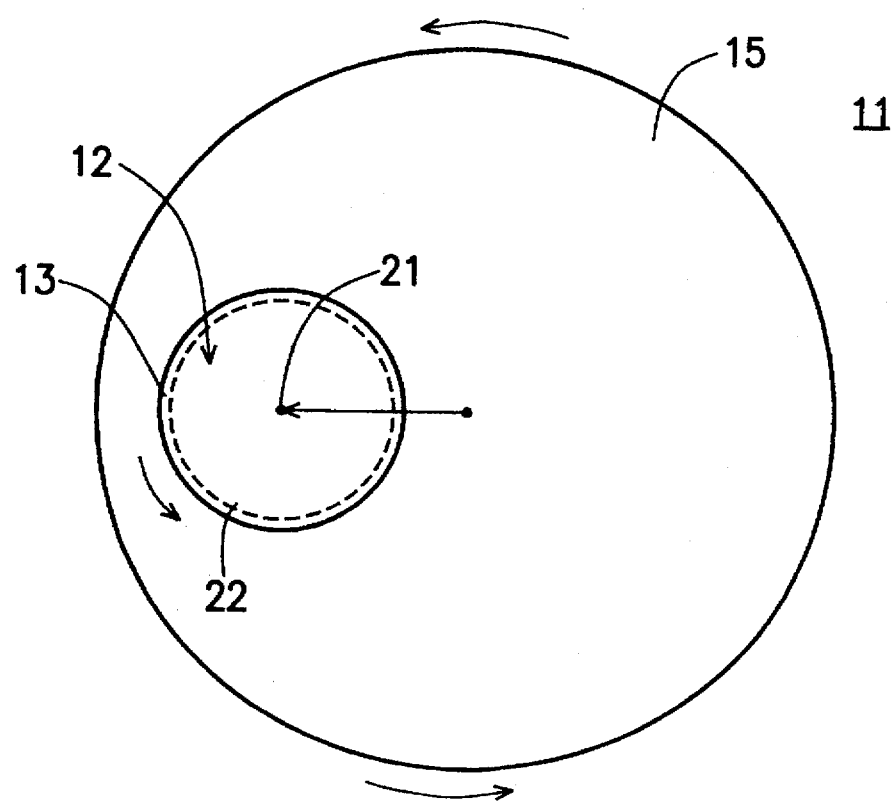
FIG. 2 is a schematic plan view showing rotation of a polishing platen and polishing head for chemical-mechanical polishing of a semiconductor wafer.

With reference to FIG. 1 and FIG. 2, an apparatus suitable for performing a chemical-mechanical polishing (CMP) process is shown and generally designated as 11. The chemical-mechanical polishing (CMP) apparatus 11 includes a wafer polishing head 13 for holding a semiconductor wafer 12. The head 13 is mounted for continuous rotation by a drive motor 18 and exerts a downward pressure on the wafer 12. The (CMP) apparatus 11 also includes a polishing platen 15 mounted for rotation by a drive motor 19. A polishing pad 14 formed of polyurethane is mounted to the polishing platen 15. A polishing slurry containing an abrasive fluid, such as colloidal silica in an aqueous KOH solution, is deposited through a conduit 16 onto the surface of the polishing pad 14.

Figure 3:
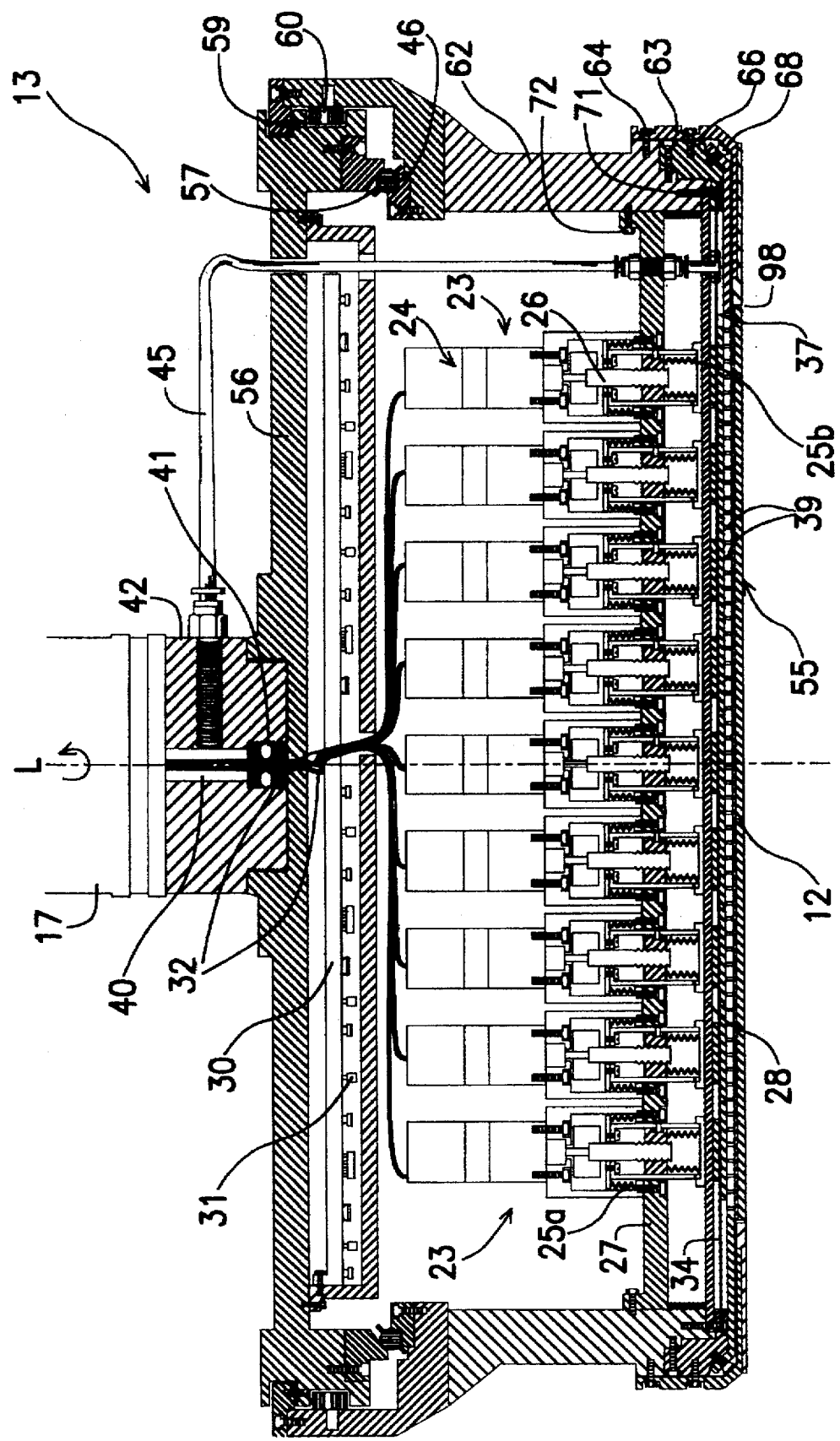
FIG. 3 is a sectional view of the polishing head according to a preferred embodiment of this invention.
Figure 4:
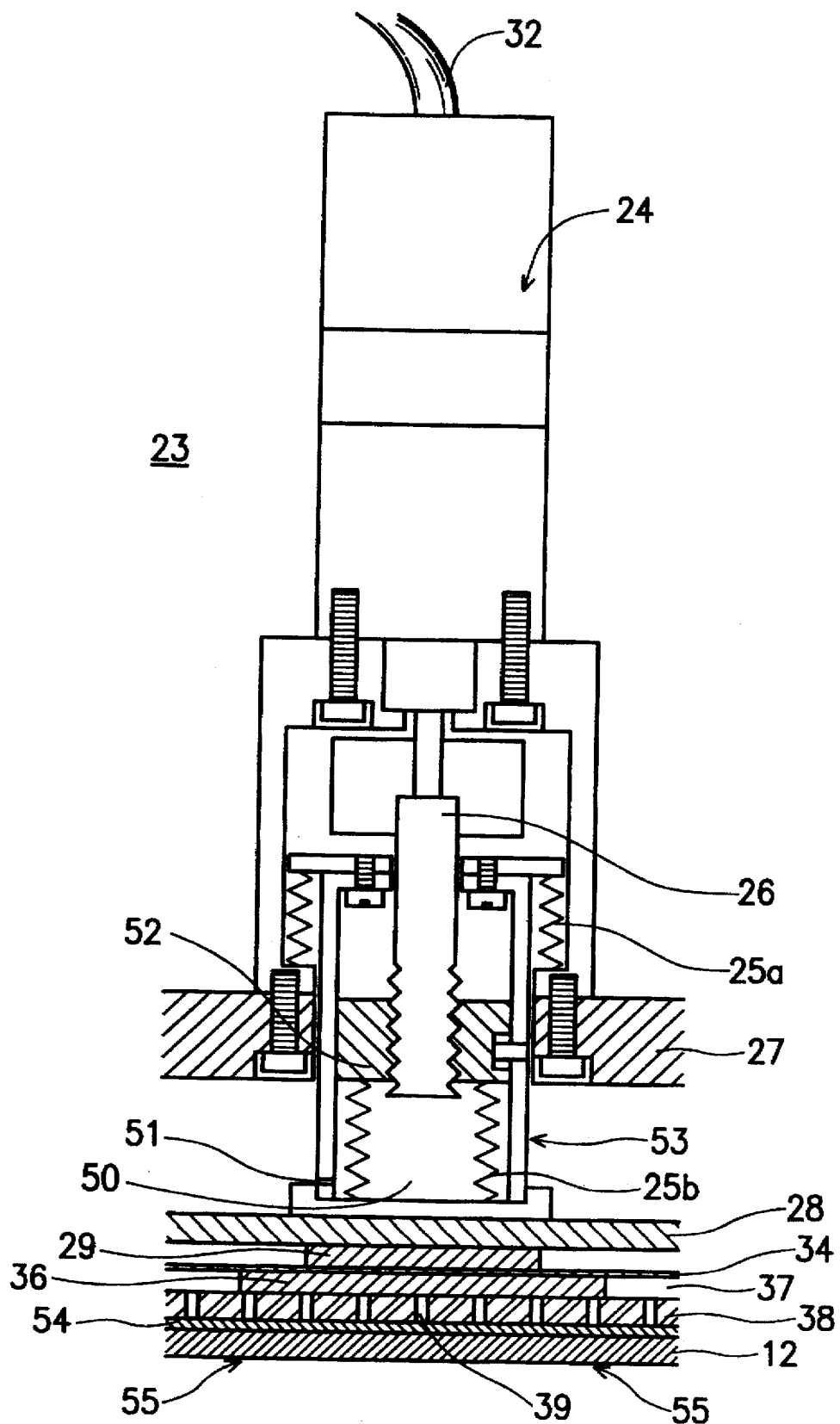
FIG. 4 is a sectional view of the active actuator with other parts relationship.

Referring now to FIG. 3 and FIG. 4, a polishing head constructed with active actuators and endpoint detection function in accordance with this invention is shown and generally designated as 13, and comprises actuators 23, a reaction plate 27, a microprocessor 31, a motor driver and its related circuits 30 (FIG. 3), a flexible plate 28, load cells 29, a hexagonal packing plate 36 and a flexible carrier plate 38 (FIG. 4). The polishing head 13 includes an upper exterior main machined part 56 which provides the desired mounting to spindle 42 via a coupler 17. The lower main machined part 62 supports all the active actuators and its related parts. The coupling between the upper part 56 and the lower part 62 comprises a bearing gimbal 57. About the central vertical axis L, the bearing gimbal 57 sits on a base 46. This configuration concentrates the applied pressure forces from the coupler 17 on the center of the wafer surface 55 for uniform force distribution. The lower part 62 is secured to the upper part 56 by stoppers 60. Springs 59 are located between the upper part 56 and the lower part 62 to allow freedom of movement.

Figure 5A:
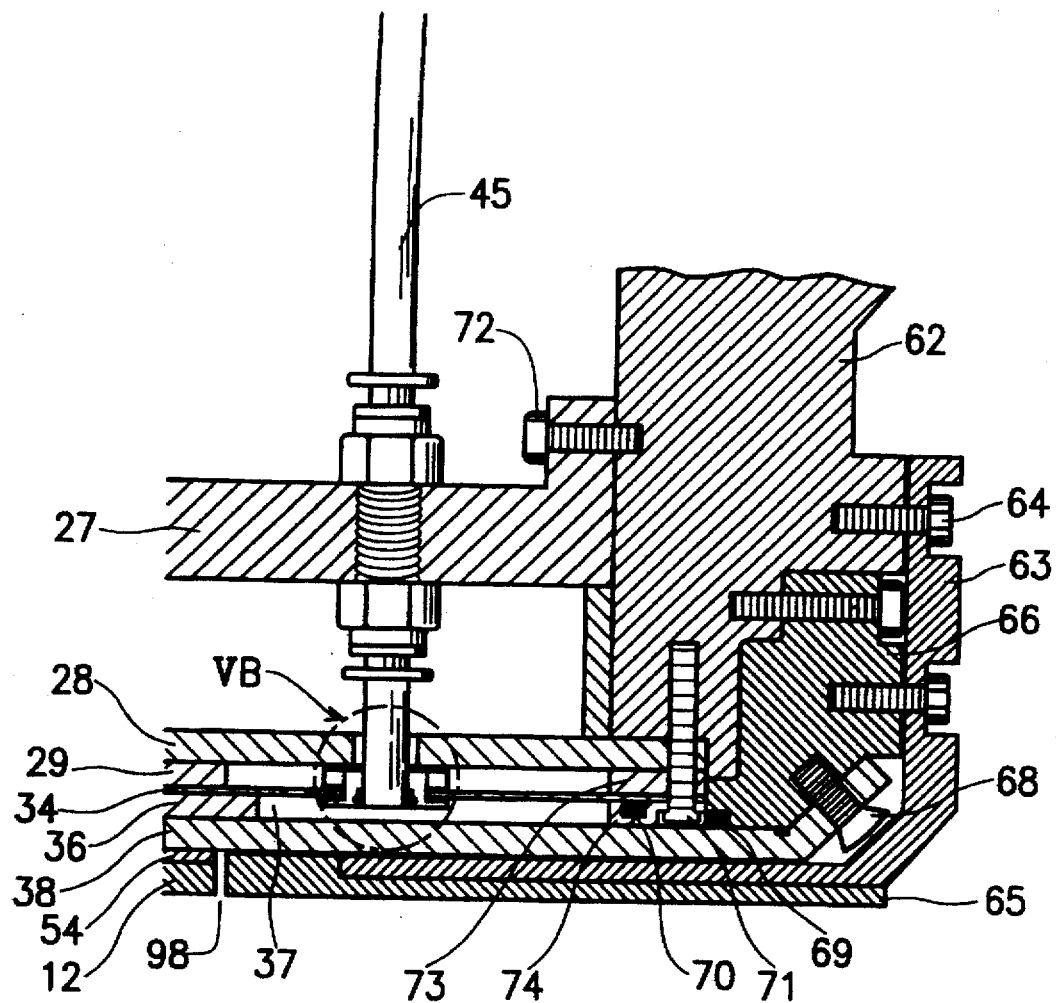
FIG. 5 is another sectional view of the polishing head according to the preferred embodiment of this invention, showing a vacuum conduit, a flexible plate and a thin metal plate.
Figure 5B:
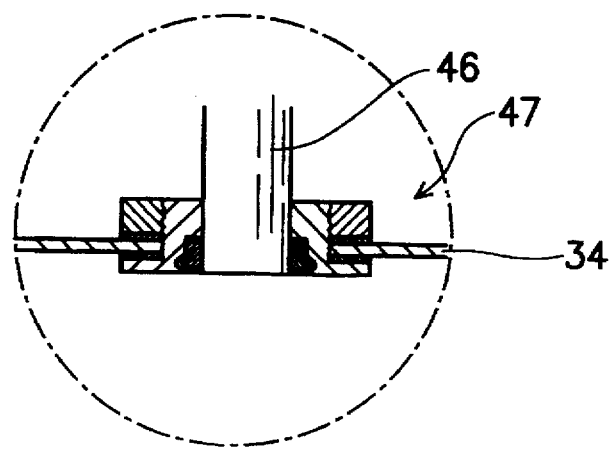
Figure 8:
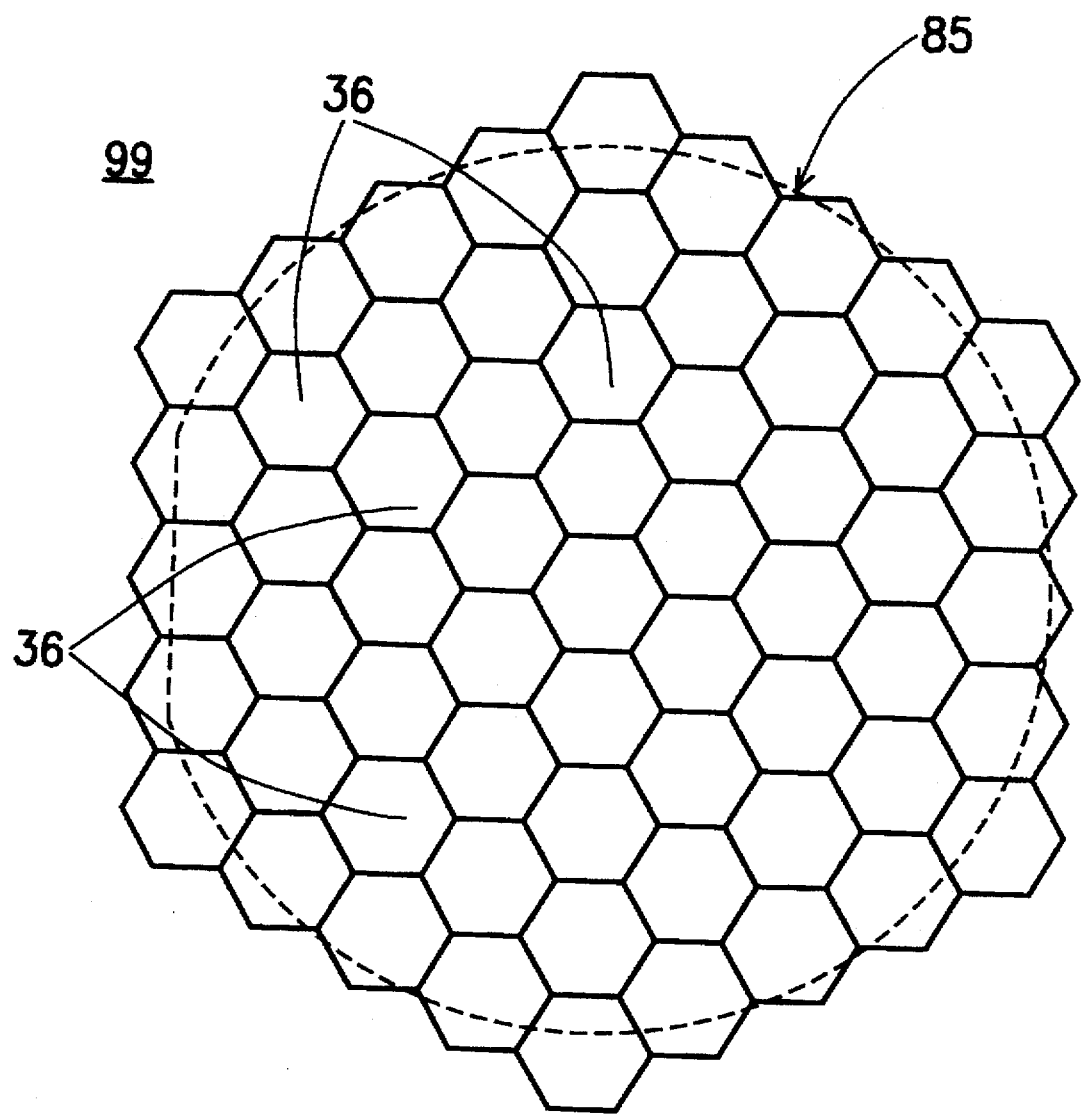
FIG. 8 is a plan view of a hexagonal packing plate.

Each actuator 23 includes a moving part 53 and a DC-motor with an encoder and gear head 24 connected with a lead screw 26 and then with a nut 52. The main body of each actuator is attached on the reaction plate 27 which is connected to the lower main part 62 by screws 72. The moving part 53 of each actuator 23 is coupled to the flexible plate 28. The flexible plate 28 is made from carbon fiber and its edge is secured to the inside wall of the lower part 62 by screws 71. Each actuator 23 corresponds to a load cell 29 which glues to the flexible plate 28 and senses the actual downward force and shear friction force exerted on the wafer 12. A thin metal plate 34 glues to the load cell 29. Further referring to FIG. 5, the thin metal plate 34 is secured adjacent to its edge by being sandwiched between side parts 73 and 74, and an O-ring gasket 70 is provided in the side part 74. Each load cell 29 has its related hexagonal attachment 36 which glues to the thin metal plate 34. The whole set of active actuators includes an actuator 23, a load cell 29 and a plurality of hexagonal attachments 36 which are packed into a hexagonal packing plate 99, as shown in FIG. 8. The flexible carrier plate 38 is connected to the lower part 62 using screws 68 and an O-ring gasket 69. This method of connection assures that a gas-tight connection occurs between the thin metal plate 34 and the carrier plate 38 and vacuum pressure is maintained in the gap 37 between the two 34, 38. In FIG. 3 and FIG. 5, the coupler 17 has a passage 40 through which air pressure is applied. The passage 40 is coupled to a vacuum conduit 45 which is fixed on the reaction plate 27 and then connected to the thin metal plate 34 via a connector 47. The flexible carrier plate 38 has a plurality of vacuum holes 39, through which a vacuum pressure is provided to hold the wafer 12 securely in place. A retaining ring 63 glued with a plastic plate 65 is coupled to the lower part 62 using screws 64. The retaining ring 63 glued with the plastic plate 65 is used to hold an attached wafer 12 from sliding during the polishing process.

Figure 6:
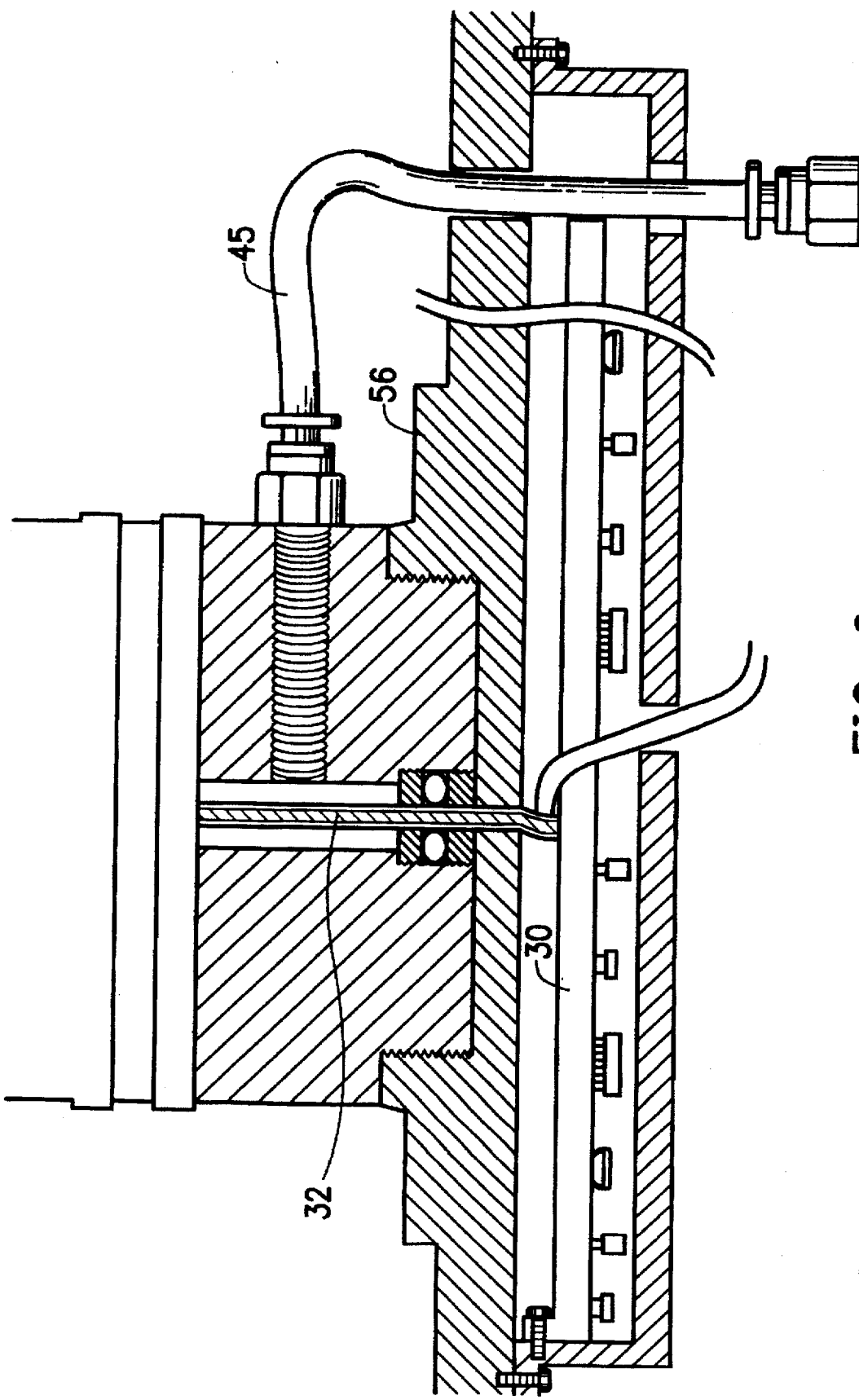
FIG. 6 is a schematic view of a circuit board provided with a plurality of electrical elements according to the preferred embodiment of this invention.

As shown in FIG. 3 and FIG. 6, the circuit board 30 under the main part 56 carries a plurality of electrical elements such as a microprocessor, a motor driver, a plurality of memory chips, a plurality of interface chips and a force-sensing circuit. A plurality of electric power and signal wires 32 go through the passage 40 with an O-ring gasket 41.

Referring back to FIG. 4, the moving part 53 of the actuator 23 has two sets of springs 25a and 25b. Loads of approximately 20N (Newton) each for the two sets of springs 25a, 25b cancel out each other so that the null force condition exists between the reaction plate 27 and flexible plate 28. An air passage 51 allows the air to go in and out from the chamber 50 in the moving part 53 when the actuator 23 is driven by the DC-motor 24. The output shaft of the DC-motor 24 is a lead screw 26. A gear head (not shown) is mounted on the lead screw 26 to increase the output torque of the DC-motor 24. Using the Physik Instrumente (PI) DC-motor coupled with an encoder and gear head, for example, Model C-120.80 and C-121.07, which has 8460 counts in one turn and the lead screw 26 with a 1 mm pitch, the actuator can achieve sub-micrometer scale movement for each step.

Figure 7:
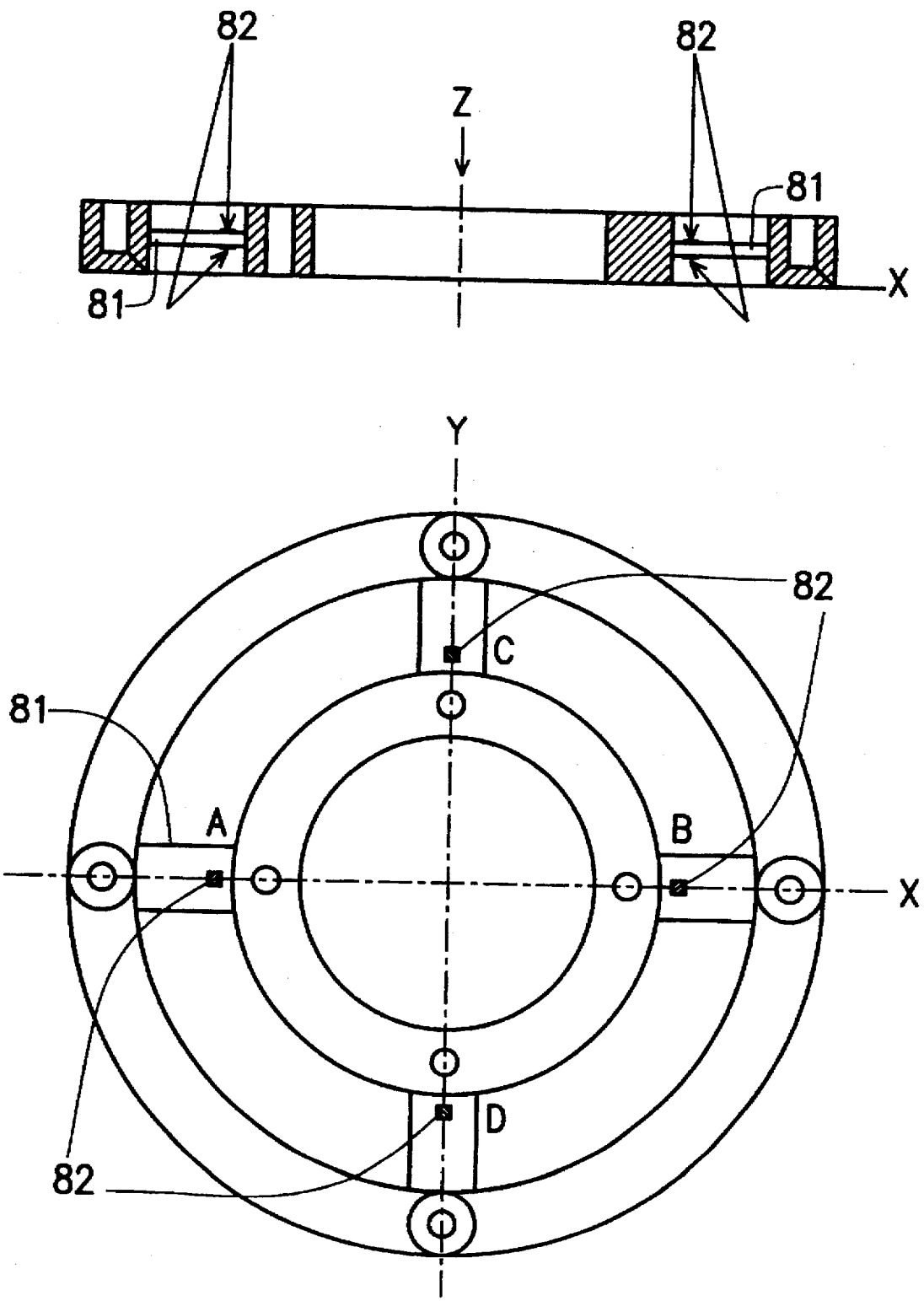
FIG. 7 is the sectional and plan views of a load cell.

FIG. 7 shows the sectional and plan views of load cell 29, in which each of the four bridges 81 has a pair of strain gauges 82 on both sides to compensate the temperature gradient. The signal from each pair of strain gauges under stress conditions is derived from a Wheatstone Bridge Circuit. The downward force is detected by analyzing the signal of the strain gauges 82 generated by the same Z-direction bending of all the bridges 81. The shear force in the X-direction, for example, is detected by analyzing the differential signal of the strain gauges 82 between positions A and B resulting from different bending effects. By analyzing the differential signal of the strain gauges 82 from four different positions A, B, C and D, the shear force of any direction in the XY-plane can be derived.

FIG. 8 shows the whole set arrangement of the hexagonal attachments plate 36, in which the broken line 85 indicates the edge of the wafer 12. There are sixty-one hexagonal attachments 36 in this pattern. The numbers of the actuators 23 in the polishing head 13 have the same sixty-one sets in this example. During the polishing processes, the load cells 29 detect the actual shear force acting on the wafer surface 55 and feed this data back to the microprocessor 31 to adjust the pressure of each actuator 23. The microprocessor 31 sequentially controls the DC-motors and receives the signals from the load cells 29 through multiswitchs in a short period of time. The wafer surface profile changes are fully controlled either in a local or global planarized process during the polishing action.

Figure 9:
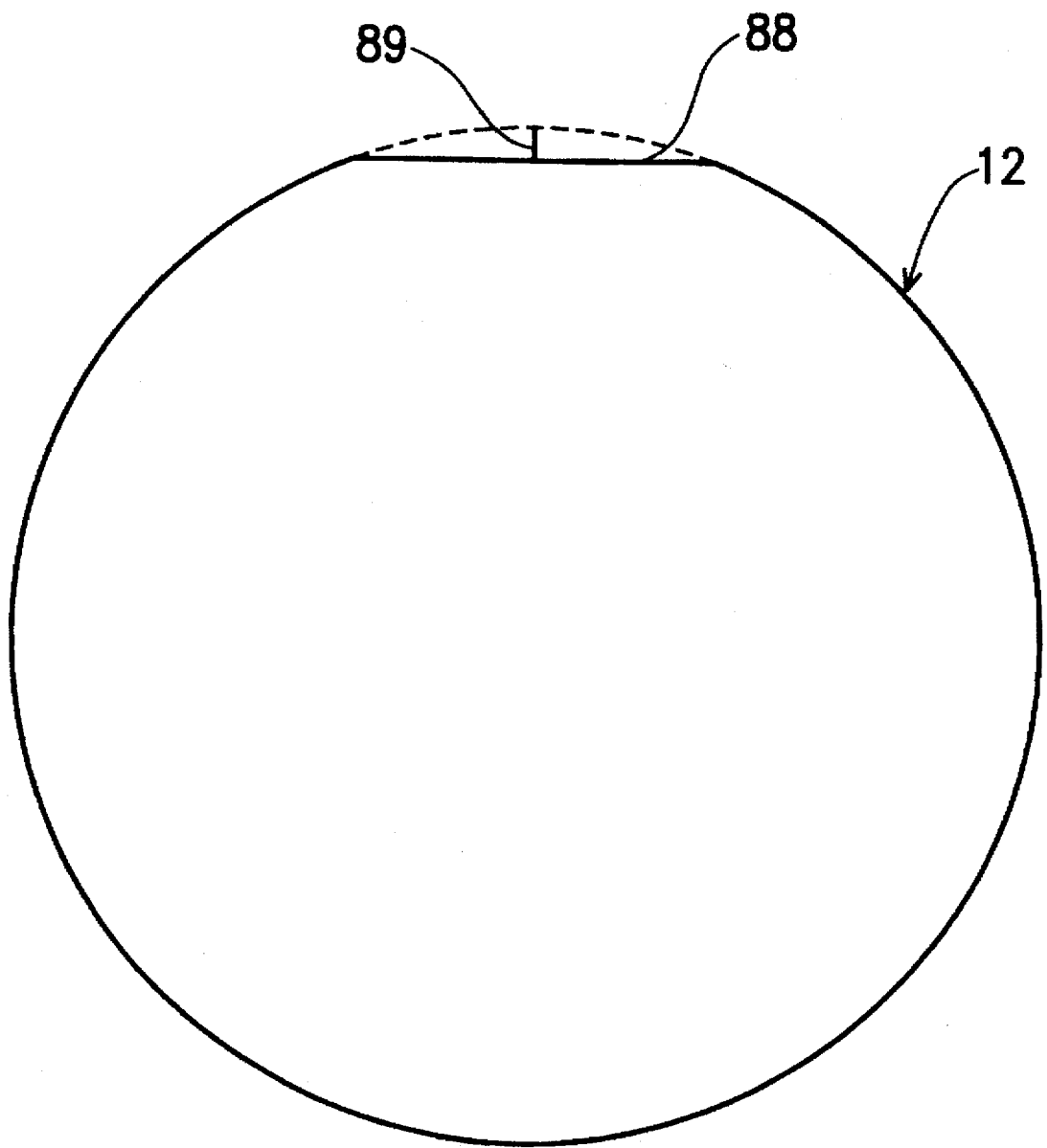
FIG. 9 is a plan view of a semiconductor wafer with a flat cut.

FIG. 9 shows the plan view of a semiconductor wafer, in which the wafer 12 is generally circular in shape and includes a major flat cut 88. Also referring to FIG. 3 or FIG. 5, the wafer 12 is held by the template pocket 98 of retaining ring 63 and rotated with the polishing head 13 during the polishing process. As shown in FIG. 4, an insert 54 is provided on the bottom surface of the flexible carrier plate 38 to directly touch the wafer 12. The insert 54 is soft enough and thus can protect the wafer 12 from scraping.

However, this arrangement may cause the wafer 12 to unexpectedly rotate in the template pocket 98 with respect to the polishing head 13. Because of the relatively high frictional forces between the wafer back side and the backing material, it is assumed that this rotation is relatively slow but it changes the orientation of the wafer 12 within the template pocket 98. For a 200 mm diameter wafer for example, the maximum gap 89 of the flat cut 88 is more than 5 mm. This gap 89 of the flat cut 88 can be detected by the local strain gauge on the load cell 29 at the edge of the head 13. The position information of the flat cut 88 as an orientation of the wafer is fed back to the microprocessor 31 in the circuit 30 to adjust the force distributions of all the actuators 23.

In polishing processes, the rate of removing material is based on the Preston hypothesis, from which it follows:

$$R = K \cdot P \cdot V \quad (1)$$

where

R is the amount of material removed in unit time;

K is a constant for the conditions of polishing, which characterizes the diameter of the polishing grain, the pad type and so on;

P is the pressure along the normal to the surface being rubbed; and

V is the relative velocity between the two surfaces.

Equation (1) is applicable until a critical value of P is reached. In general, the equation is non-linear in character:

$$R = \phi(P,V)$$

The parameter P for example, is related to the average pressure $P_s$ or the actual shear force acting on the surface by the relationship:

$$P_s = f \cdot P$$

where f is the coefficient of sliding friction, which is a function of slurry concentration and hardness of the thin film material on the surface of the wafer.

The value $P_s$ is not linearly related to P. So equation (1) becomes $$R = K \cdot \frac{P_s}{f} \cdot V$$
$$= \frac{K}{f} \cdot P_s \cdot V$$

Compared to the conventional precision glass polishing surfacing method, the chemical-mechanical polishing (CMP) processes use higher pressure and higher relative velocity and create problems for meeting stringent planarization standards. The most challenging problems are non-uniform polishing within the wafer, especially on the wafer edge, a non-uniform removal rate from wafer to wafer, and poor endpoint detection.

The wafer 12 under the polishing head 13 is rotated at high speed. From FIG. 2, the relative velocity of the wafer edge 22 is higher than the wafer center 21. The polishing rate R of the wafer edge 22 is then faster than that of the wafer center 21. The polishing head 13 can apply lower pressure through the active actuators 23 on the wafer edge 22 than at the center 21. The removal rate R in the polishing process thus becomes equally distributed across the whole wafer surface 55 even at a high rotation speed of the head 13. Because polishing pressure on the wafer surface 55 is measured by the shear force, not the downward force, the removal rate of the polishing process acting on the wafer surface 55 is controlled with better accuracy.

Figure 10:
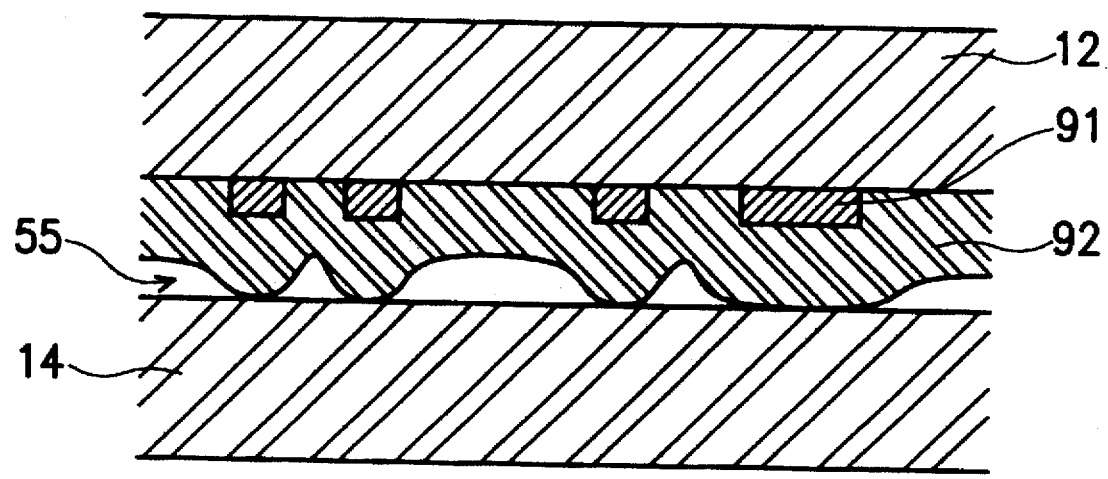
FIG. 10 is a sectional view of a wafer undergoing polishing, in which its interconnect structures are shown.
Figure 11:
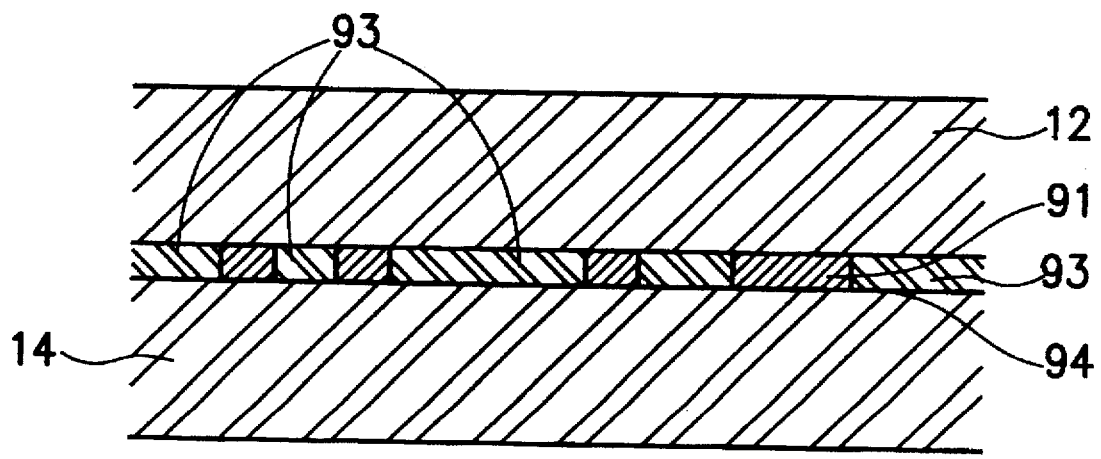
FIG. 11 is a sectional view showing the polished wafer that has reached the endpoint, wherein the oxide coating has already been to the level of the interconnects.

In general, different layers of the semiconductor wafer are formed of different materials (i.e. metallic film, polysilicon film, oxide film) which have a different relative hardness. As shown in FIG. 10, a semiconductor wafer typically includes a substrate 12, on which a plurality of IC devices 91 have been formed. An oxide coating 92 may then be formed or deposited on the substrate lo and over the IC devices 91. It is necessary to remove the oxide coating 92 to the level of the IC devices to form insulating spacers 93 therebetween, as shown in FIG. 11. The coefficient of friction of the oxide film 92 in contact with the pad 14 is constant until the film is polished away to the level that the surface 94 of the IC devices and oxide spacer 93 is exposed. A different coefficient of friction thus occurs between the surface of the IC devices 91 and the surface of the pad 14. The change in coefficient of friction between the planar surfaces is detected by the load cells 29 with an ample signal level. For different materials, the difference of the friction coefficients will be more than 0.05. The 0.05 change indicates a 5% difference of shear force value and constitutes an ample signal level. The signal is sent back to the microprocessor 31 as an endpoint to the polishing process.

The apparatus and the method described herein is controlled by the microprocessor 31 in the circuit 30. After the polishing routine is started, the microprocessor 31 then calculates the optimum rotating speed of the head 13 and the platen 15, each actuator pressure Ps and polishing time according to the required removal rate, film thickness distribution. Once the polishing process is started, the load cells monitor the shear forces acting on the wafer surface 55 and the orientation of the wafer 12 by sensing the flat cut region 88 at the edge. The microprocessor 31 collects the actual shear force at wafer surface 55 and orientation data from each load cell 29 at series time scale and adjusts the corresponding actuator forces immediately after calculating the correction data. The unusual signal changes from the measurement shear force is also used as an emergency stop indication either because the wafer 12 may have slid off the head 13 or a part within the polishing head 13 has failed, or even some failure has occurred in the chemical-mechanical polishing apparatus 11 during the polishing process. The microprocessor 31 also calculates the removal rate R continuously during the whole polishing process. Once the film thickness on the wafer surface 55 reaches a set value, the microprocessor 31 will stop the polishing process. If it is necessary to remove the surface layer from the wafer surface to reach the under layer of different material, the endpoint detection function is implemented through carefully monitoring the friction force changes.

Figure 12:
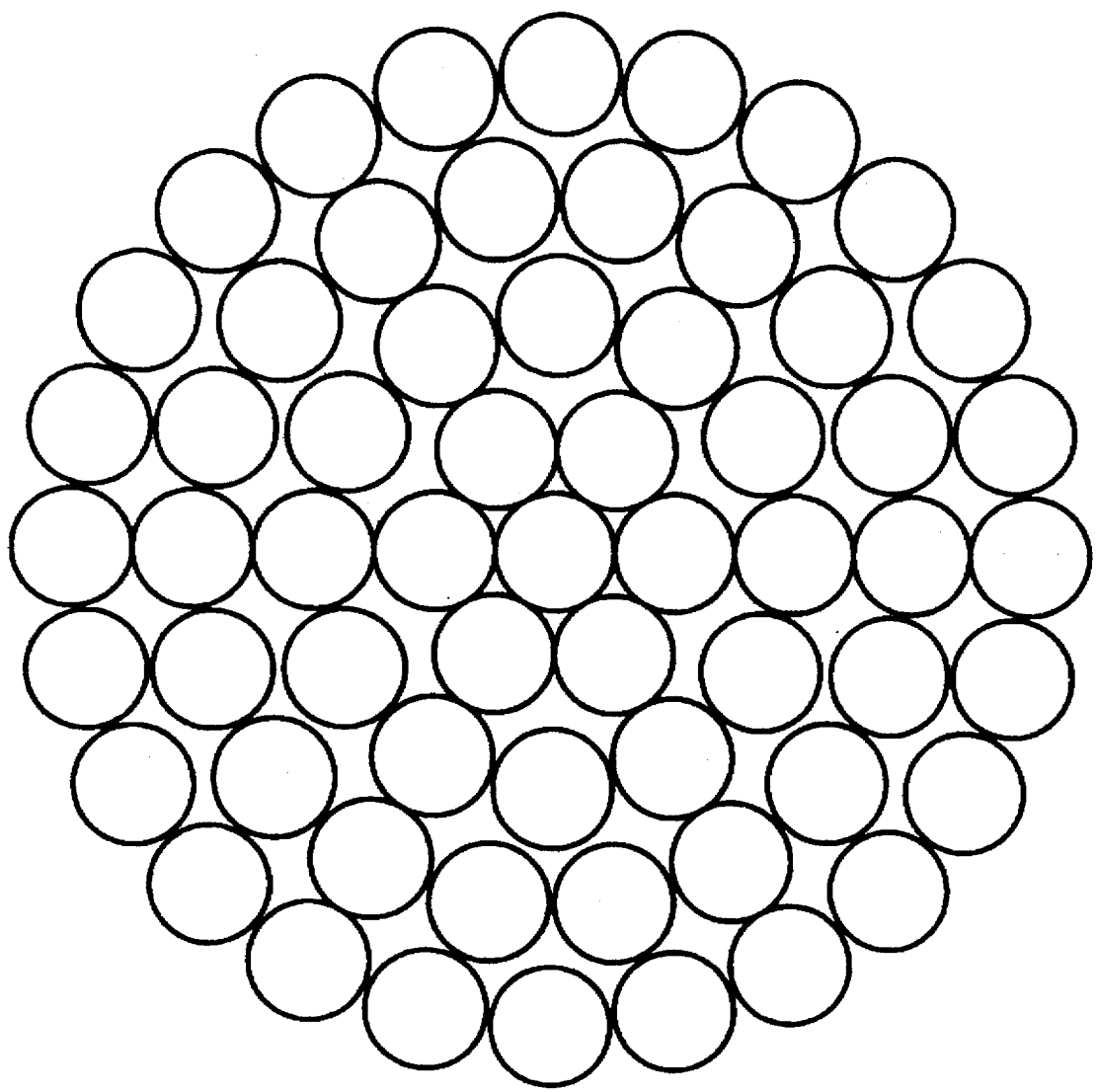
FIG. 12 is a plan view of a circular packing plate.

While the process of the invention has been described with reference to a preferred embodiment thereof, as will be apparent to those skilled in this art, certain changes and modifications can be made without departing from the scope of the invention as defined by the following claims. For example, in the described embodiment the actuators may use stacked piezoelectric translators (PZT) or magnetostrictive actuators, stepping motors, hydraulic cylinders instead of a DC-motor with lead screw to apply pressure to the wafer during polishing process. The arrangement of hexagonal attachments may be more densely or loosely packed. The actuator can be arranged in a concentric circular ring shape, as shown in FIG. 12. The shear force can also be measured by quartz crystal transducers or other methods.

What is claimed is:

1. A polishing head for polishing a semiconductor wafer on a platen, comprising:

a flexible plate;

a plurality of actuators, each of which has a DC-motor and a moving part coupled with said DC-motor to exert a force on said flexible plate;

a reaction plate for fixing said actuators;

a motor driver sequentially driving said DC-motors;

a packing plate comprising a plurality of attachment packed together;

a plurality of load cells, each of which is correspondingly sandwiched between said flexible plate and one of said attachments, for sensing said force and then outputting first signals;

a flexible carrier plate provided with a plurality of holes and fixed on a bottom of said head for carrying said packing plate;

a vacuum source for providing a vacuum force through said holes to hold said wafer on said bottom of said head; and a microprocessor for receiving said first signals from said load cells and controlling said motor driver to drive said DC-motors.

2. The polishing head for polishing a semiconductor wafer as claimed in claim 1, further comprising a metal plate glued between said packing plate and said load cells.

3. The polishing head for polishing a semiconductor wafer as claimed in claim 1, wherein said attachments are hexagonal.

4. The polishing head for polishing a semiconductor wafer as claimed in claim 1, wherein said attachments are circular.

5. The polishing head for polishing a semiconductor wafer as claimed in claim 1, wherein said load cells further sense shear friction forces between said wafer and said platen and then sends second signals to said microprocessor which decides when to stop polishing said wafer based on an endpoint.

6. The polishing head for polishing a semiconductor wafer as claimed in claim 5, wherein said endpoint is defined as an oxide coating of said wafer polished to a surface including a different material.

7. The polishing head for polishing a semiconductor wafer as claimed in claim 5, wherein said endpoint is defined as changes of said shear friction forces.

8. The polishing head for polishing a semiconductor wafer as claimed in claim 5, wherein said wafer has a flat cut, and said load cells can detect said flat cut and send third signals to said microprocessor which then adjusts said force exerted by said DC-motor based on said first and third signals.

* * * * *